United States Patent
Yanagisawa et al.

(10) Patent No.: US 6,455,438 B1
(45) Date of Patent: Sep. 24, 2002

(54) FABRICATION METHOD FOR A SEMICONDUCTOR DEVICE

(75) Inventors: Azusa Yanagisawa; Koki Muto; Tadashi Nishimuro; Katsuo Oshima; Akira Watanabe; Akihiko Nara; Kouhei Shimoyama; Keisuke Tanaka; Takamitsu Furukawa; Shouzou Kobayashi, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 32 days.

(21) Appl. No.: 09/662,855

(22) Filed: Sep. 15, 2000

(30) Foreign Application Priority Data

Mar. 13, 2000 (JP) ........................................ 2000-068776

(51) Int. Cl.⁷ .............................................. H01L 21/00
(52) U.S. Cl. ........................... 438/725; 216/41; 216/79; 438/723; 438/743
(58) Field of Search ................................ 438/723, 725, 438/743, 742; 216/18, 41, 67, 79

(56) References Cited

U.S. PATENT DOCUMENTS 5,776,836 A * 7/1998 Sandhu ........................ 438/723

* cited by examiner

Primary Examiner—William A. Powell
(74) Attorney, Agent, or Firm—Venable; Robert J. Frank (57) ABSTRACT

According to the present invention, a semiconductor device is fabricated by the following processes. First, a film to be etched is formed on a semiconductor substrate. On the film to be etched is formed a resist film. Then, a first pattern group including first patterns having a first size and a second pattern group including second patterns arranged outside of the first pattern group are formed by exposure. The resist film is then developed to form openings in the resist film so that the resultant openings correspond to the first and second patterns, respectively. The openings are then made smaller by annealing the resist film. The aforementioned processes enables openings having substantially the same shape to be formed in the film to be etched.

12 Claims, 6 Drawing Sheets

FABRICATION METHOD FOR A SEMICONDUCTOR DEVICE

BACKGROUND OF THE INVENTION

1. Field of Invention

The present invention relates to a fabrication method for a semiconductor device, and in particular to a technique for forming an opening in a resist film and then annealing the resist film to make the diameter of the formed opening smaller.

2. Description of the Related Art

Conventionally, an opening such as a contact hole is formed in an insulation film or the like formed on a semiconductor substrate in the following manner.

First, the insulation film such as a silicon oxide film is formed on the entire surface of the semiconductor substrate. Next, a resist film is formed on the insulation film and is then exposed and developed, so as to form the opening in the resist film. The resist film having the opening thus formed is then subjected to an annealing process, thus making the diameter of the opening smaller. After making the diameter of the opening smaller, the insulation film is etched using the resist film as a mask.

According to the conventional method, however, since the diameter of the opening formed in the resist film is made smaller by annealing the resist film as described above, the amount of reduction in the diameter varies depending on the position of the opening. This makes it hard to form openings having a uniform shape for a film that is to be etched.

SUMMARY OF THE INVENTION

Therefore, it is an object of the present invention to provide a fabrication method for a semiconductor device that can allow openings having a uniform shape to be formed in the film to be etched, even if the sizes of the openings formed in the resist film are reduced by the annealing process.

In order to achieve the above object, according to the present invention, openings having different shapes are formed in the resist film. More specifically, according to an aspect of the present invention, a fabrication method for a semiconductor method includes: forming a film to be etched on a semiconductor substrate; forming a resist film on the film to be etched; exposing the resist film to form a first pattern group and a second pattern group therein, the first pattern group including a plurality of first patterns having a first size, the second pattern group arranged outside of the first pattern group, including a plurality of second patterns larger than the first patterns; developing the resist film to form in the resist film, openings corresponding to the first patterns and the second patterns; and annealing the resist film to make the openings smaller.

In an embodiment of the present invention, the first pattern group is formed by exposure using a first mask, while the second pattern group is formed by exposure using a second mask different from the first mask.

In another embodiment of the present invention, in the first pattern group the first patterns are arranged at a substantially constant interval.

In still another embodiment of the present invention, the amount of exposure for forming the second pattern group is larger than that for forming the first pattern group.

In still another embodiment of the present invention, an opening of the first mask has a smaller diameter than that of an opening of the second mask.

In still another embodiment of the present invention, the diameter of each of the openings corresponding to the first patterns after the annealing is substantially the same as the diameter of each of the openings corresponding to the second patterns after the annealing.

According to another aspect of the present invention, a fabrication method for a semiconductor device includes: forming a film to be etched on a semiconductor substrate; forming a first resist film on the film to be etched; forming a first opening and a second opening in the resist film, the second opening being located away from the first opening by a first distance; annealing the first resist film to make the first and second openings smaller; forming in the film to be etched a third opening and a fourth opening respectively corresponding to the first opening and the second opening that have been made smaller; removing the first resist film after the third opening and the fourth opening are formed in the film to be etched; forming a second resist film on the film to be etched; forming a fifth opening in a region of the second resist film corresponding to a position between the third and fourth openings; annealing the second resist film to make the fifth opening smaller; and forming in the film to be etched a sixth opening corresponding to the fifth opening.

In an embodiment of the present invention, the formation of the first and second openings in the first resist film and the formation of the fifth opening in the second resist film are performed by exposure and development using a single mask.

In another embodiment of the present invention, the distance between the first opening and the second opening is twice the diameter of the first opening or more.

According to still another aspect of the present invention, a fabrication method for a semiconductor device includes: forming a film to be etched on a semiconductor substrate; forming a first resist film on the film to be etched; forming a plurality of first openings in the first resist film; annealing the first resist film and then removing a part of the film to be etched that is exposed through the first openings; removing the first resist film and then forming a second resist film on the film to be etched including an area in which the film to be etched has been removed; forming a plurality of second openings in regions of the second film respectively corresponding to regions between adjacent two of the first openings; and annealing the second resist film and then removing a part of the film to be etched that is exposed through the second openings.

This summary of the invention does not necessarily describe all necessary features so that the invention may also be a sub-combination of these described features.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

FIG. 2A is a plan view used for explanation of a second embodiment of the present invention, while

DETAILED DESCRIPTION OF THE PREFERRED EMBODIMENTS

The invention will now be described based on preferred embodiments, which do not intend to limit the scope of the present invention, but rather to exemplify the invention. All of the features and the combinations thereof described in the embodiments are not necessarily essential to the invention.

Embodiment 1

The first embodiment of the present invention is described with reference to FIGS. 1A, 1B and 1C.

Figure 1A:
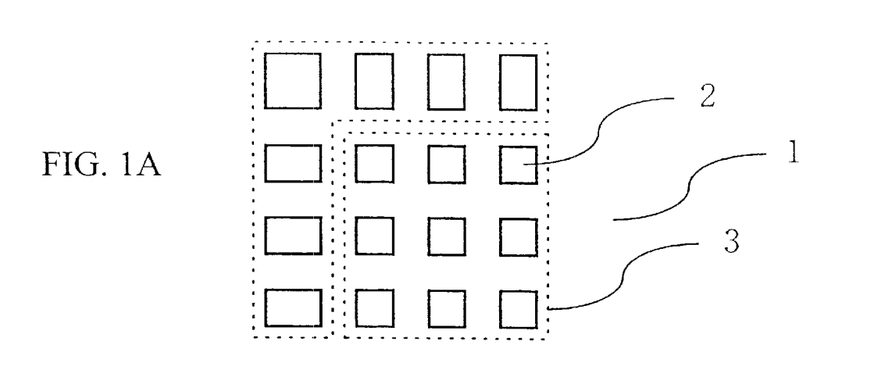
FIGS. 1A, 1B and 1C are plan views illustrating fabrication processes of a fabrication method according to a first embodiment of the present invention.

First, a resist film I is exposed so as to form a first pattern group 3 including a plurality of first patterns 2, as shown in FIG. 1A. In this example, the resist film 1 is formed with a thickness of about 0.65 μm. All of the first patterns 2 that are arranged in a matrix have the same shape of a square with sides of 0.26 μm, for example. The resist film 1 is formed on a film to be etched (not shown) that is formed on a semiconductor substrate (not shown). For example, an insulation film, such as a silicon oxide film deposited by a CVD method, is formed as the film to be etched.

Figure 1B:
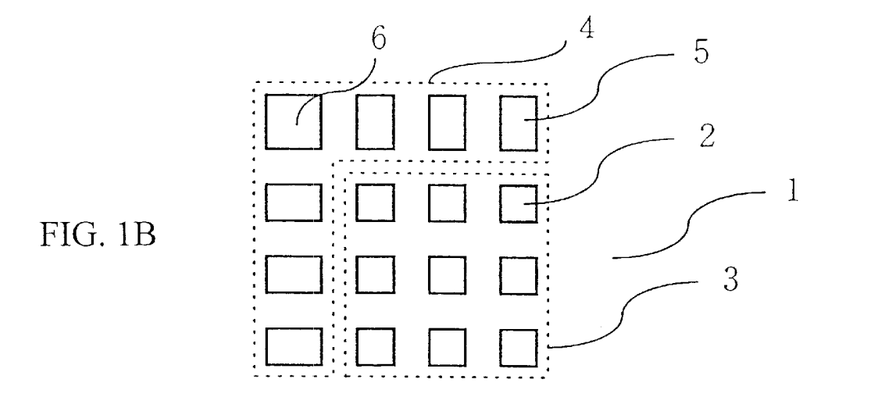
Figure 1C:
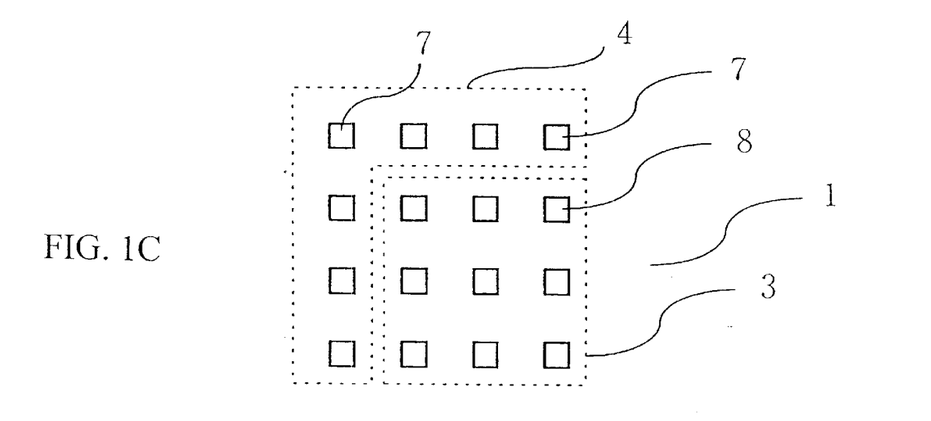

Next, a second pattern group 4 is formed outside of the first pattern group 3 that includes the first patterns 2 arranged in a matrix, by exposing the resist film 1, as shown in FIG. 1B. The second pattern group 4 includes second patterns 5 each having a shape obtained by enlarging the first pattern 2 in one direction and third patterns 6 each having a shape obtained by enlarging the first pattern 2 in two directions. In this example, the shape of the second pattern 5 is obtained by enlarging that of the first pattern 2 by 0.02 μm in the direction opposite to the side on which the first patterns 2 are formed with respect to the position of the second pattern 5, thus having a size of 0.26 μm×0.28 μm. Similarly, the shape of the third pattern 6 is obtained by enlarging that of the first pattern 2 by 0.02 μm in the directions opposite to the side of the first pattern 2 with respect to the position of the second pattern 5, thus having a size of 0.28 μm×0.28 μm.

The second pattern group 4 is formed by exposure, using a different mask from that used for the first pattern group 3.

After exposure to form the second pattern group 4, portions of the resist film that have been exposed are developed, thus forming openings in the resist film 1 corresponding to the first pattern group 3 and the second pattern group 4.

The resist film 1 having the openings formed therein is then subjected to an annealing process for one minute at a temperature of 135° C. As a result, reduced-size openings 7 are obtained, as shown in FIG. 1C.

Because of the annealing process, the resist material flows into the openings formed in the resist film 1 so that the diameter of each opening is reduced. In the openings corresponding to the second patterns 5 and the third patterns 6 that are arranged on the outside of the first pattern group 3, the flow of the resist material into the openings is limited on the side on which the openings corresponding to the first patterns 2 are formed. On the other hand, on the side opposite to the first pattern group 3, there is a sufficient amount of the resist material because no opening is formed on that side. Thus, in the openings corresponding to the second patterns 5 and the third patterns 6, the amount of size reduction is greater on the side opposite to the first patterns 2 than that on the side on which the first patterns 2 are formed. Therefore, as long as the second patterns 5 and the third patterns 6 are formed by exposure, and have shapes obtained by enlarging in the direction(s) opposite to the first patterns 2, the reduced-size openings 7 can have substantially the same shape as that of the openings 8 after the size reduction. In the present embodiment, the diameter of each opening after size reduction is approximately 0.1 μm.

In the present embodiment, the first pattern group 3 and the second pattern group 4 are formed in different shapes by exposure using different masks. In this exposure, it is typical to use for the first pattern group 3 a mask having a shape different from that of the mask for the second pattern group 4. Alternatively, the amount of exposure may be varied between the first pattern group 3 and the second pattern group 4, while using a mask having the same size of mask patterns, both for the first pattern group 3 and the second pattern group 4.

The amount of exposure can be adjusted in the case where it is difficult to form openings in the mask corresponding to the second patterns 5, so as to have a sufficient size.

In the present embodiment, the first pattern group 3 and the second pattern group 4 are formed using separate masks. Alternatively, when the patterns corresponding both to the first pattern group 3 and the second pattern group 4 are formed in a single mask, the first pattern group 3 and the second pattern group 4 can be formed using the single mask. In this case, a single exposure process forms all of the patterns.

Embodiment 2

Next, the second embodiment of the present invention is described, referring to FIGS. 2A through FIG. 5C.

Figure 2A:
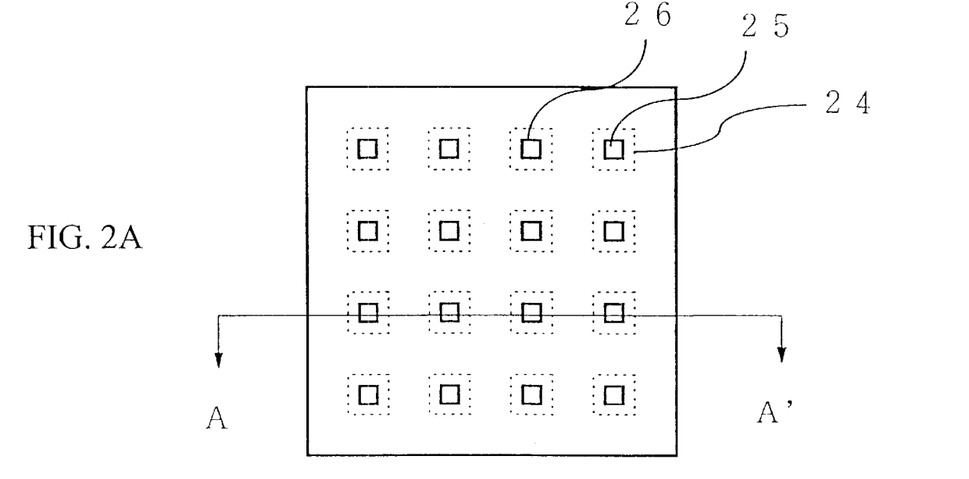
Figure 2B:
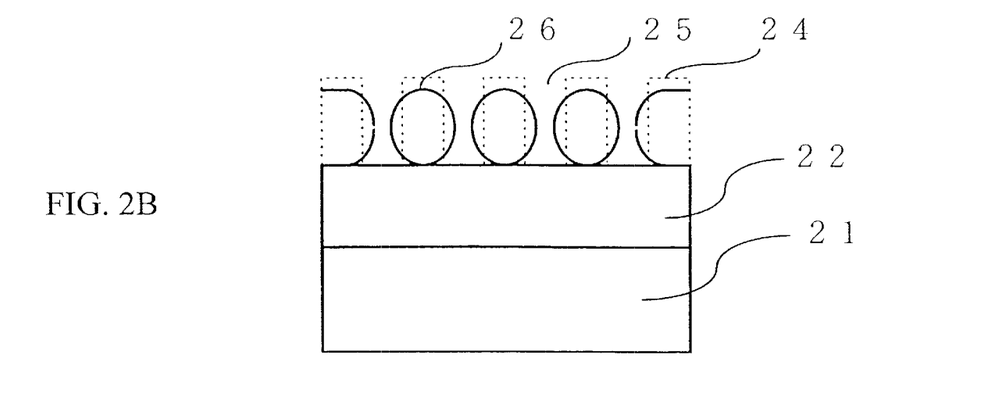
FIG. 2B is a cross-sectional view taken along a line A–A' in FIG. 2A.

FIG. 2A shows a state where, after the resist film is exposed and developed to form predetermined openings, the openings are made smaller by annealing the resist film. FIG. 2B is a cross-sectional view taken along a line A–A' in FIG. 2A.

In FIG. 2B, an insulation film 22 such as a silicon oxide film deposited by a CVD method, is formed on a semiconductor substrate 21. In order to form openings in the insulation film 22, resist material is applied on the insulation film 22 by, for example, spin-coating to about 0.65 μm thickness, so as to form a resist film 24. The resist film 24 is exposed and developed by a known photolithography method or the like, thus openings 25 are formed in the resist film 24. After the openings 25 are formed, the resist film 24 is subjected to an annealing process. This process softens the resist film 24, so that a resist film 26 having a shape expanded into the openings 25 is formed. That is, the shape of each opening 25 is made smaller than that before the annealing process.

When the openings 25 arranged in a repeating and concentrated manner are formed in the resist film 24 as described above, the resist material expands, and the height thereof becomes lower due to the annealing process. In other words, as shown in FIG. 2B, the shape of the resist film 24 shown with a broken line changes into the shape of the resist film 26 shown with solid line.

The resist film 26 has a shape in which the middle portion expands more than the upper and lower portions, as shown in FIG. 2B. Therefore, in a case where the insulation film 22 is etched by a plasma method or the like, it is likely that openings to be formed in the insulation film 22 are connected to each other. This is significant when the distance between adjacent openings before the annealing process is twice the size of the opening before the annealing process or less.

FIGS. 3, 4A–4C and 5A–5C illustrate a fabrication method of a semiconductor device according to the second embodiment of the present invention, that can suppress deformation of the resist film caused by the annealing process shown in FIGS. 2A and 2B. The fabrication method is described in detail below, referring to FIGS. 3, 4A–4C and 5A–5C.

The second embodiment has a feature where the openings are formed by repeating formation processes. In this example, the openings are formed by repeating the formation processes twice.

Figure 3:
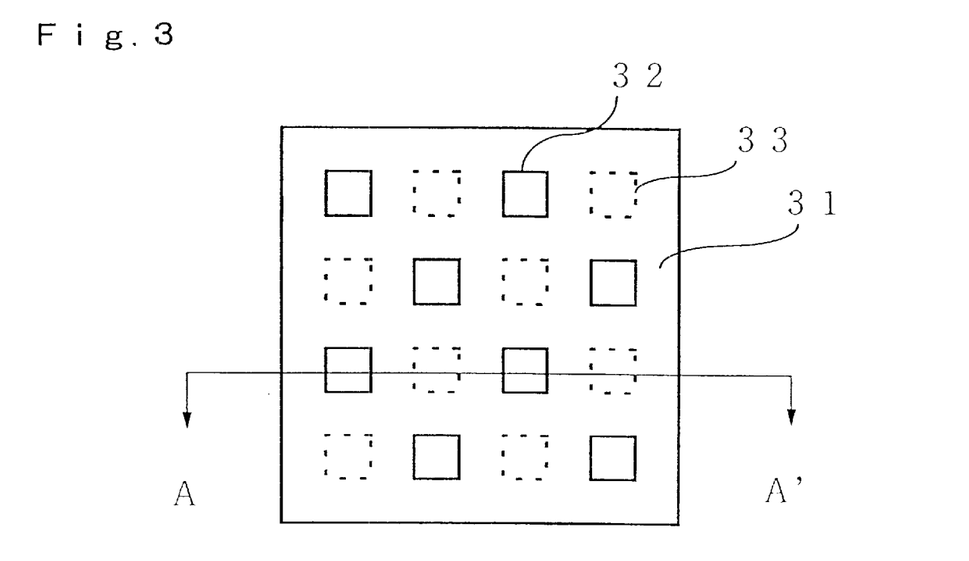
FIG. 3 is a plan view illustrating the second embodiment of the present invention.

FIG. 3 shows positions of openings to be formed in a resist film 31. The openings 32 shown by a solid line are formed by a first opening-formation processes, while the openings 33 shown by a broken line are formed by a second opening-formation processes.

Figure 4A:
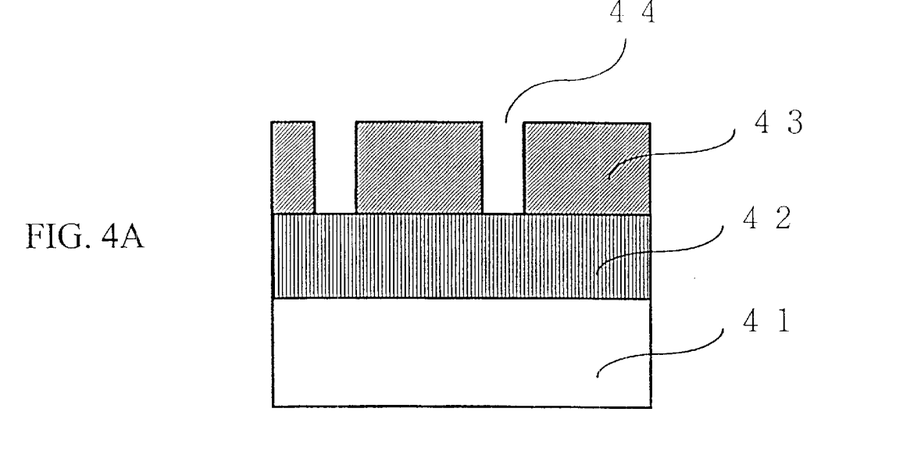
FIGS. 4A, 4B and 4C are cross-sectional views showing processes of a fabrication method according to the second embodiment of the present invention.
Figure 4B:
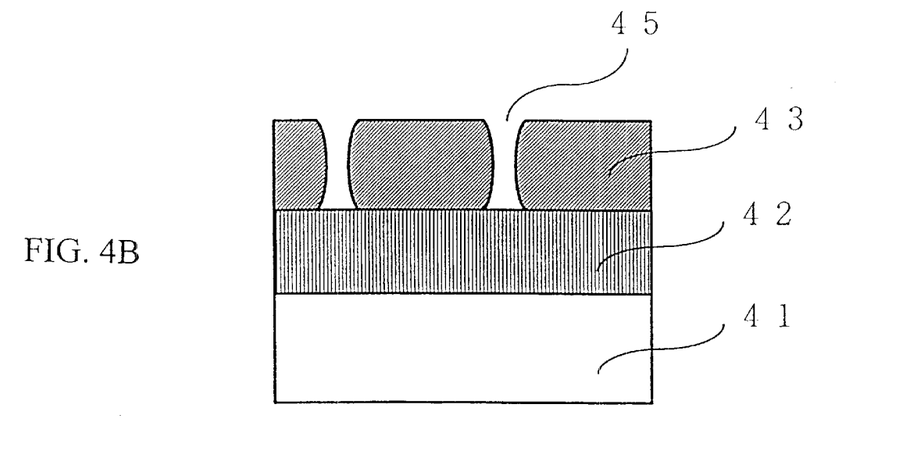
Figure 4C:
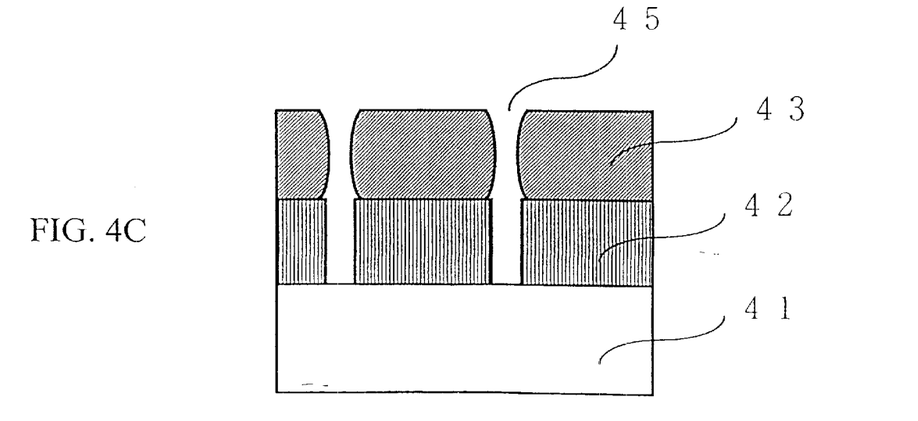
Figure 5A:
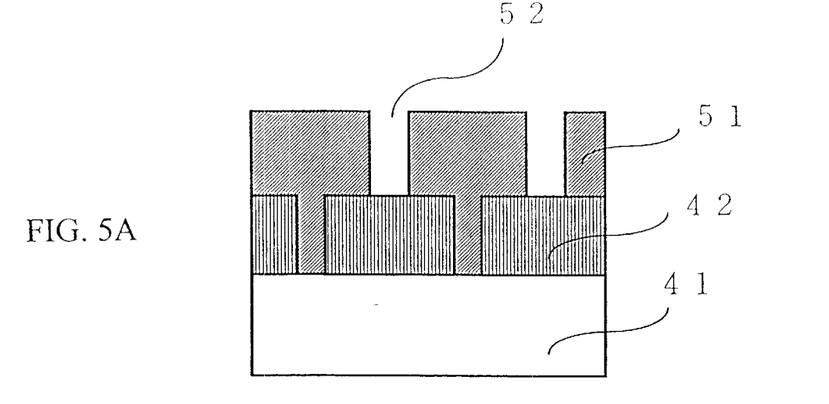
FIGS. 5A, 5B and 5C are cross-sectional views showing processes of the fabrication method according to the second embodiment of the present invention.
Figure 5B:
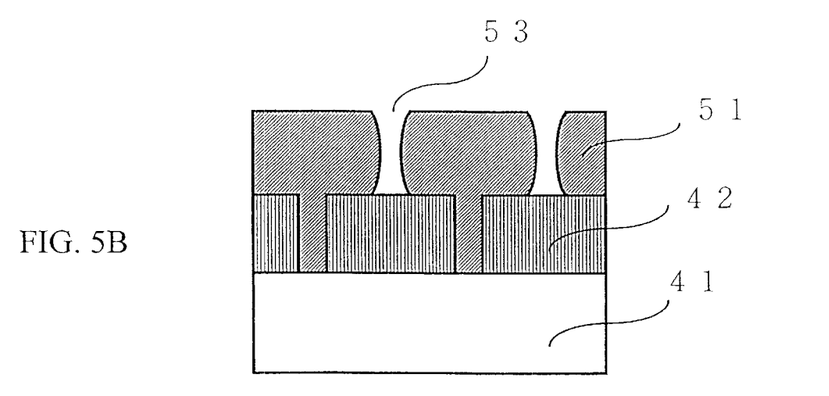
Figure 5C:
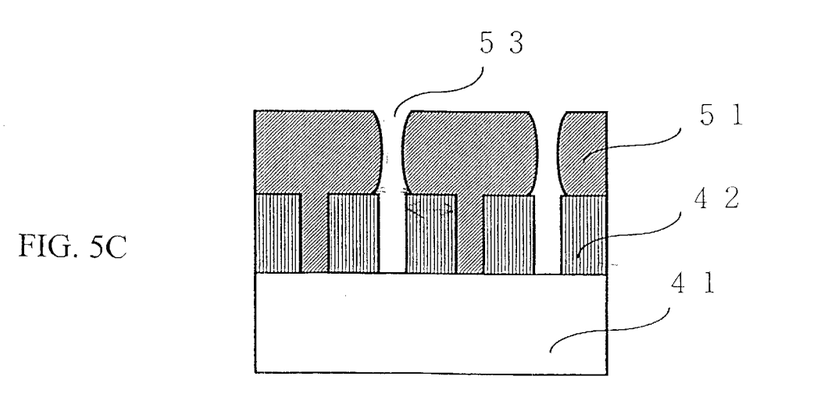

FIGS. 4A–4C and 5A–5C are cross-sectional views taken along a line A–A' in FIG. 3. FIGS. 4A, 4B and 4C show the first opening-formation processes; and FIGS. 5A, 5B and 5C show the second opening-formation processes.

In FIG. 4A, an insulation film 42 is formed on a semiconductor substrate 41. The insulation film 42 is a silicon oxide film deposited by a CVD method, for example. On the insulation film 42 is formed a resist film 43 on which openings 44 are formed by known exposure and development techniques. The openings 44 correspond to the openings 32 shown by the solid line in FIG. 3. In the exposure, a mask corresponding to the openings 44 are used.

The resist film 43 having the openings 44 formed therein is then subjected to the annealing process for one minute, at a temperature of 135° C. As a result, the resist material expands into the openings 44, and thus reduced-size openings 45 are formed, as shown in FIG. 4B.

Although the aforementioned annealing process makes the size of the openings smaller, the amount of deformation of the resist film 43 can be suppressed. This is because the arrangement of the openings 44 are not concentrated, that is, the openings 44 are arranged in a staggered manner in which every other opening appears aligned.

Next, the insulation film 42 is etched using the resist film 43 as a mask, as shown in FIG. 4C. At this time, the openings 45 in the resist film 43 have been made smaller by the annealing process of the resist film 43. The insulation film 42 is etched by, for example, a plasma CVD method.

After the insulation film 42 is etched, the remaining resist film 43 is removed. Then, resist material is applied to the entire insulation film 42 so as to form a new resist film 51, as shown in FIG. 5A. The resist film 51 is exposed and developed by known techniques, and thus openings 52 are formed in the resist film 51. The openings 52 correspond to the openings 33 shown by the broken line in FIG. 3. In the exposure of the resist film 51, a mask different from that used for forming the openings 44 shown in FIG. 4A is used. It should be noted that the resist material for the resist film 51 is applied within the openings that have been formed in the insulation film 42 using the resist film 43.

The resist film 51 having the openings 52 formed therein is then subjected to the annealing process for one minute, at a temperature of 135° C. This makes the resist material expand into the openings 52, and thus reduced-size openings 53 are obtained, as shown in FIG. 5B.

Although the openings are made smaller by the annealing process, the amount of deformation of the resist film 51 can be suppressed because the arrangement of the openings 53 is not concentrated.

Next, as shown in FIG. 5C, the insulation film 42 is etched using the resist film 51 as a mask. The openings 53 in the resist film 51 have already been made smaller by the annealing process of the resist film 51. Moreover, the insulation film 42 is etched using a plasma CVD method, for example.

In a case where the ratio of the size of the opening after development to the distance between adjacent openings after development is 1:2, the amount of deformation of the resist material caused by the annealing process is large. In another case, for example, where the openings are repeatedly arranged in the resist film in such a manner that the ratio of the size of the opening to the distance between the adjacent openings is 1:1, the deformation of the resist film caused by the annealing process can be suppressed by forming the consecutive openings by the first and second opening-formation processes. In this way, every other opening is formed in each opening-formation process, as described in the present embodiment.

Figure 6:
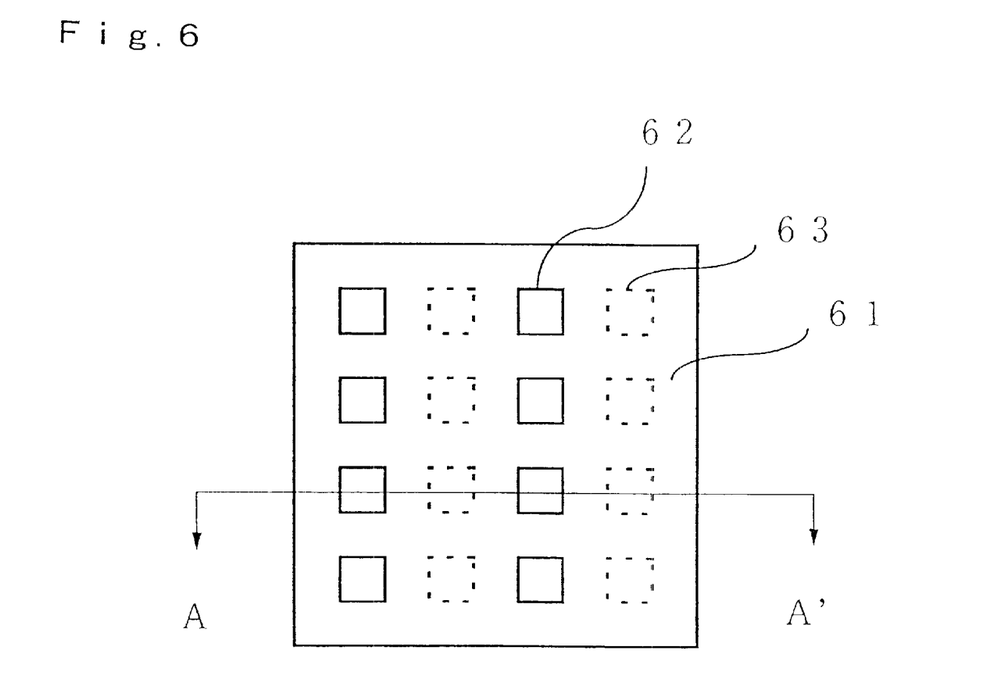
FIG. 6 is a plan view showing a modified example of the second embodiment of the present invention.

Alternatively, as shown in FIG. 6, openings 62, shown by solid line, formed by the first exposure and development and other openings 63, shown by broken line, formed by the second exposure and development may be arranged in straight dines so that the lines of the openings 62 and the lines of the openings 63 are alternately arranged, as shown in FIG. 6. In this case, the processes of the fabrication method are the same as those in the fabrication method shown in FIGS. 4A–4AC and 5A–5C, and therefore the cross-sectional views in the respective processes are the same as the corresponding ones shown in FIGS. 4A–4C and 5A–5C. Thus, the detailed description of the respective steps is omitted here. When the openings are arranged as shown in FIG. 6, the exposure for forming the respective openings can be performed by using a single mask.

Although the present invention has been described by way of exemplary embodiments, it should be understood that many changes and substitutions may be made by those skilled in the art without departing from the spirit and the scope of the present invention.

What is claimed is:

1. A fabrication method of a semiconductor comprising:
   forming a film to be etched on a semiconductor substrate;
   forming a resist film on the film to be etched;
   exposing the resist film to form a first pattern group and a second pattern group therein, the first pattern group including a plurality of first patterns having a first size, the second pattern group, arranged outside of the first pattern group, including a plurality of second patterns having a second size larger than said first size;
   developing the resist film to form in the resist film openings corresponding to the first patterns and the second patterns; and
   annealing the resist film to make the openings smaller.

2. The fabrication method of claim 1, wherein the first pattern group is formed by exposure using a first mask, while the second pattern group is formed by exposure using a second mask different from the first mask.

3. The fabrication method of claim 1, wherein in the first pattern group the first patterns are arranged at a substantially constant interval.

4. The fabrication method of claim 2, wherein a duration of exposure time for forming the second pattern group is greater than that for forming the first pattern group.

5. The fabrication method of claim 2, wherein an opening of the first mask has a smaller diameter than that of an opening of the second mask.

6. The fabrication method of claim 1, wherein a diameter of each of the openings corresponding to the first patterns after the annealing is substantially the same as a diameter of each of the openings corresponding to the second patterns after the annealing.

7. A fabrication method for a semiconductor device, comprising:

forming a film to be etched on a semiconductor substrate;

forming a first resist film on the film to be etched;

forming a first opening and a second opening in the resist film, the second opening being located away from the first opening by a first distance;

annealing the first resist film to make the first and second openings smaller;

forming in the film to be etched a third opening and a fourth opening respectively corresponding to the first opening and the second opening that have been made smaller;

removing the first resist film after the third opening and the fourth opening are formed in the film to be etched;

forming a second resist film on the film to be etched;

forming a fifth opening in a region of the second resist film corresponding to a position between the third and fourth openings;

annealing the second resist film to make the fifth opening smaller; and forming in the film to be etched a sixth opening corresponding to the fifth opening.

8. The fabrication method of claim 7, wherein the formation of the first and second openings in the first resist film and the formation of the fifth opening in the second resist film are performed by exposure and development using a single mask.

9. The fabrication method of claim 8, wherein the distance between the first opening and the second opening is not less than twice a diameter of the first opening.

10. A fabrication method for a semiconductor device, comprising:

forming a film to be etched on a semiconductor substrate;

forming a first resist film on the film to be etched;

forming a plurality of first openings in the first resist film;

annealing the first resist film and then removing a part of the film to be etched that is exposed through the first openings;

removing the first resist film and then forming a second resist film on the film to be etched including an area in which the film to be etched has been removed;

forming a plurality of second openings in regions of the second resist film respectively corresponding to regions between an adjacent two of the first openings; and annealing the second resist film and then removing a part of the film to be etched that is exposed through the second openings.

11. The fabrication method of claim 8, wherein the distance between the first opening and the second opening is substantially equal to a diameter of the first opening.

12. The fabrication method of claim 10, wherein the formation of the plurality of the first openings is performed by exposure and development using a different mask than a mask used in the formation of the plurality of the second openings.

* * * * *